(12) United States Patent
Oberst et al.

(10) Patent No.: US 9,195,055 B2
(45) Date of Patent: Nov. 24, 2015

(54) ELECTRONIC COMPONENT

(71) Applicant: Harman Becker Automotive Systems GmbH, Karlsbad (DE)

(72) Inventors: Wieland Oberst, Kraichtal (DE); Guenther Kraft, Karlsruhe (DE); Valod Noshadi, Ettlingen (DE); Michael Huonker, Rosenfeld-Isingen (DE); Kelei Shen, Karlsruhe (DE)

(73) Assignee: HARMAN BECKER AUTOMOTIVE SYSTEMS GMBH, Karlsbad (DE)

( * ) Notice: Subject to any disclaimer, the term of this patent is extended or adjusted under 35 U.S.C. 154(b) by 0 days.

(21) Appl. No.: 14/173,211

(22) Filed: Feb. 5, 2014

(65) Prior Publication Data

US 2014/0233086 A1 Aug. 21, 2014

(30) Foreign Application Priority Data

Feb. 20, 2013 (EP) .................................... 13156006

(51) Int. Cl.
*G02B 26/08* (2006.01)
*B81B 7/00* (2006.01)
*H01L 23/38* (2006.01)

(52) U.S. Cl.
CPC ............ *G02B 26/0833* (2013.01); *B81B 7/007* (2013.01); *H01L 23/38* (2013.01); *B81B 2201/042* (2013.01); *B81B 2207/096* (2013.01); *H01L 2224/48091* (2013.01); *H01L 2224/48227* (2013.01); *H01L 2924/1461* (2013.01)

(58) Field of Classification Search
CPC ..... G02B 26/0833; B81B 7/007; H01L 23/38
See application file for complete search history.

(56) References Cited

U.S. PATENT DOCUMENTS

| | | | |
|---|---|---|---|
| 5,784,782 | A | 7/1998 | Boyko et al. |
| 6,487,083 | B1 | 11/2002 | Kwong |
| 6,531,341 | B1 | 3/2003 | Peterson et al. |
| 2003/0063247 | A1 | 4/2003 | Kalyandurg |
| 2006/0024919 | A1 | 2/2006 | Yang |
| 2012/0201008 | A1 | 8/2012 | Hershberger et al. |

FOREIGN PATENT DOCUMENTS

DE 102006058563 B3 6/2008

OTHER PUBLICATIONS

Extended European Search Report, EP 13156006.2, Nov. 4, 2013.
Kopola H. et al., "MEMS Sensor Packaging Using LTCC Substrate Technology", Proceedings of SPIE, S P I E—International Society for Optical Engineering, US, vol. 4592, Dec. 19, 2001, pp. 148-158, XP001179280, ISSN: 0277-786X, DOI: 10.1117/12.448960.

*Primary Examiner* — David N Spector
(74) *Attorney, Agent, or Firm* — Artegis Law Group, LLP

(57) ABSTRACT

An electronic component is provided that includes a spatial light modulator device, and a circuit board comprising a first major surface, at least one electrically conductive redistribution layer and a first cavity positioned in the first major surface. The spatial light modulator device is positioned within the cavity and is electrically connected to the redistribution layer.

13 Claims, 3 Drawing Sheets

ELECTRONIC COMPONENT

CROSS-REFERENCE TO RELATED APPLICATIONS

This application claims priority to European patent application serial number 13 156 006.2-1508, filed on Feb. 20, 2013, and entitled "Electronic Component", which is hereby incorporated by reference in its entirety.

BACKGROUND OF THE INVENTION

1. Field of the Invention

The embodiments disclosed herein relate to an electronic component and, in particular, an electronic component including a spatial light modulator device.

2. Description of the Related Art

A spatial light modulator device, such as a digital micromirror device, may be used in optical display systems such as digital light projection systems. The digital micromirror device is a type of micro-electro-mechanical device which includes an array of bistable mirror elements interacting with a light source and a projection surface. Each of the mirror elements may switch between two positions, corresponding to an open or closed light configuration, based on the angle at which the mirror tilts towards the light source. By rapidly turning a particular micromirror on and off, the appropriate shade of light can be projected for a particular pixel on the projection surface.

US 2011/0057303 discloses a package for a micro-electromechanical system spatial light modulator integrated circuit which includes a carrier that serves mechanically, electrically and thermally to interface a packaged integrated circuit, such as a digital micromirror device, to the optomechanical, electrical and thermal subsystems of an end product.

Further packaging arrangements suitable for digital micromirror devices are, however, desirable.

SUMMARY OF THE INVENTION

An electronic component is disclosed that includes a spatial light modulator device, and a circuit board including a first major surface, at least one electrically conductive redistribution layer and a first cavity positioned in the first major surface. The spatial light modulator device is positioned within the cavity and is electrically connected to the redistribution layer.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details.

Figure 1:
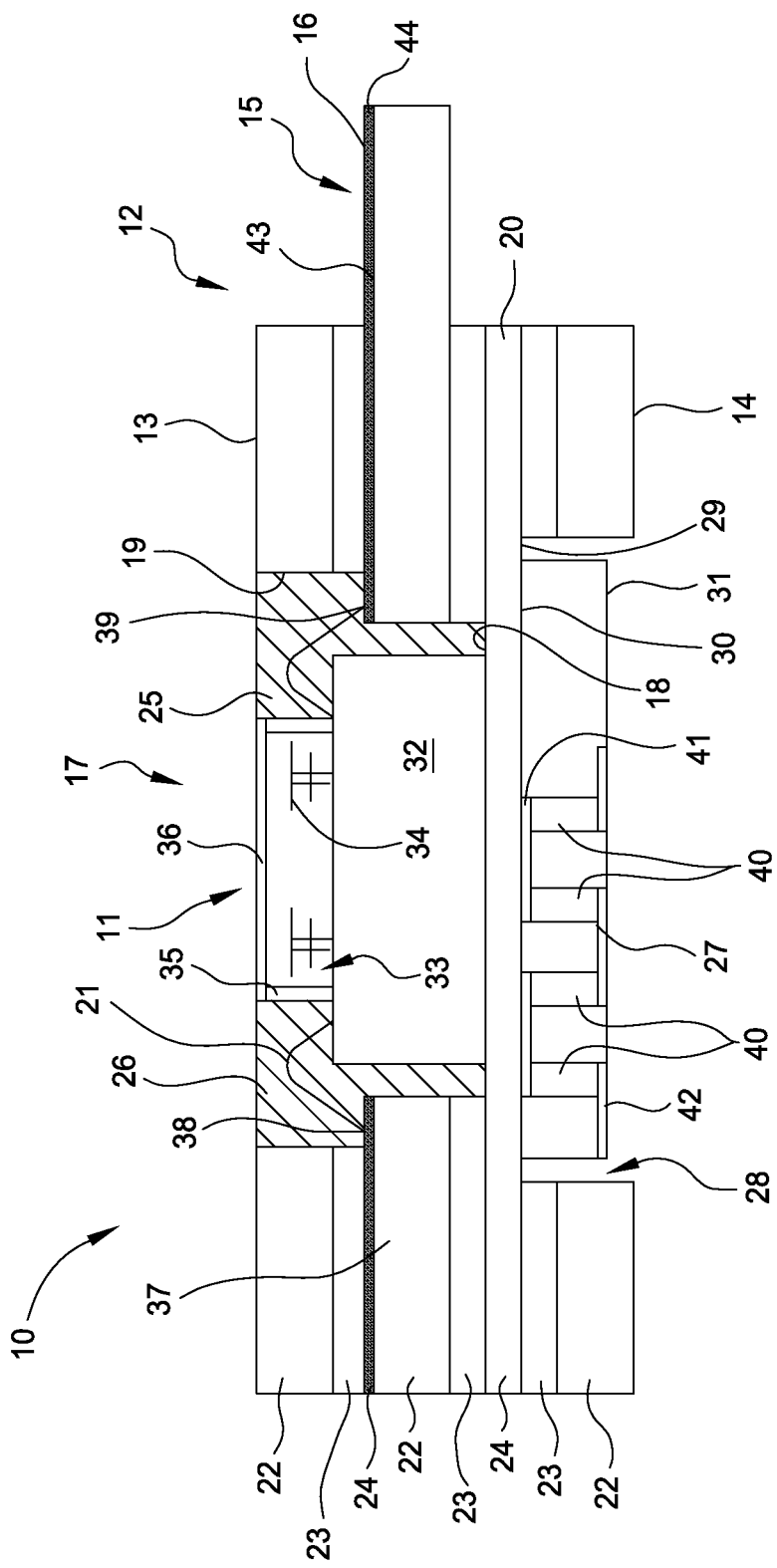
FIG. 1 is a cross sectional view of a first exemplary electronic component.

FIG. 1 illustrates a first exemplary electronic component 10. The electronic component 10 includes a spatial light modulator device 11 in the form of a digital micromirror device and a circuit board 12, in particular a printed circuit board. The circuit board 12 has a first major surface 13 and second major surface 14 which opposes the first major surface 13. The circuit board 12 further includes an electrically conductive redistribution system 15 of which a single electrically conductive redistribution layer 16 is illustrated in the cross-sectional view of FIG. 1.

The redistribution layer 16 is an inner redistribution layer as it is positioned within the bulk of the circuit board 12. The electronic component 10 further includes a first cavity 17 arranged in its first major surface 13 which is defined by a base 18 and side walls 19. The first cavity 17 has dimensions such that the spatial light modulator device 11 may be accommodated entirely within the first cavity 17. The lower portion of the first cavity 17 is laterally smaller than the upper region so that the side walls 19 of the first cavity include a step 37. The inner redistribution layer 16 extends into the first cavity 17 and forms the upper surface 38 of the step 37 of the side walls. This upper surface 38 is exposed and portions of this upper surface 38 form contact pads 39 of the redistribution layer 16.

The spatial light modulator device 11 is electrically connected by bond wires 21 to the contact pads 39 of the inner redistribution layer 16. The bond wires 21 may be arranged on one, two or four sides of the spatial light modulator device 11. The layer 22 of the circuit board on which the inner redistribution layer 16 is positioned may extend from the remaining layers of the circuitry board 12 such that an outer end 43 of the redistribution layer is exposed from the circuit board and may be used to provide external contact pads 44 of the redistribution system 15.

The circuit board 12 includes a multilayer structure in which core layers 22 are interleaved with pre-preg layers 23 and electrically conductive layers 24. The core layers 22 and pre-preg layers may include fibres, such as glass fibres, embedded in a curable resin such as epoxy. The electrically conductive layers 24 may include a copper foil. In the first example, the base 18 of the cavity 17 is formed by an electrically conductive layer 20 of the circuit board 12. The lower region of the cavity is provided by a cutout in two layers of the circuit board 12 and the upper region of the first cavity is provided by a cutout in two further layer of the circuit board 12.

To produce the first cavity 17, portions of the layers 22, 23, 24 may be removed so as to provide a plurality of layers including a cutout or through-hole. The layers 22 23, 24 may be first structured to produce the cutouts and then stacked to produce a multilayer laminate circuit board 12 including the first cavity 17. Alternatively, portions may be removed from an assembled multilayer laminate circuit board 12 to form the first cavity 17.

A digital micromirror device 11 includes a silicon substrate 32 providing the address circuitry and an upper micro-electromechanical system 33 including an array of movable mirrors 34. The digital micromirror device 11 may be packaged at the wafer level such that the micromirrors 34 are surrounded by a frame 35 and capped by a glass layer 36. The bond wires 21 extend between the silicon substrate 32 and the inner redistribution layer 16. Further carriers for this wafer-level-packaged device 11 providing chip-to-system package interface options are avoided as the wafer level packaged chip 11 is mounted directly within the circuit board 12. The silicon substrate 31 is in direct contact with the base 18 of the first cavity 17.

Regions 25 surrounding the spatial light modulation device 11 within the cavity 17 may be filled with an encapsulant 26 such as a resin. The encapsulant 26 may be used to cover the bond wires 21 to provide mechanical stability for the bond wires 21 and also to seal the bond wire connections and side faces of the spatial light modulator device 11. The micromirrors 34 and other micro-electromechanical systems 33 of the spatial light modulator device 11 remain uncovered by the encapsulant 26.

The spatial light modulator device 11 is arranged within the thickness of the circuit board 12 so that the electronic component 10 may have a lower height than an arrangement in which the spatial light modulator device 11 is positioned on first major surface 13 of the circuit board 12.

The electronic component 10 according to the first example further includes a Peltier heater/cooler device 27 which is in thermal contact with the spatial light modulator device 11. In this particular exemplary component, a second cavity 28 is provided in the second major surface 14 of the circuit board 12. The second cavity 28 is positioned underneath the first cavity 17 such that the electrically conductive layer 20 forms the base 18 of the first cavity 17 and a base 29 of the second cavity 28. This arrangement may be used to reduce the thermal path between the Peltier heater/cooler device 27 and the spatial light modulator device 11.

The Peltier heater/cooler device 27 may be a prepackaged device which is mounted in the second cavity 28 and operated by supplying current to non-illustrated contacts.

A Peltier heater/cooler device 27 may include a plurality of thermoelectric members 40 which extend between a cold plane 41 and a hot plane 42. The thermoelectric members 40 comprise p-type semiconductor material or n-type semiconductor material which are arranged in spatially alternating fashion The thermoelectric members 40 are arranged thermally in parallel and electrically in series.

In the component illustrated in FIG. 1, the Peltier heater/cooler device 27 includes thermoelectric elements 40 which extend generally perpendicularly to the second major surface 14 of the circuit board 12. The face 30 of the Peltier heater/cooler device 27 in contact with the electrically conductive layer 20 provides the cold plane 41 and the opposing surface 31 provides the hot plane 42. The hot plane 42 is exposed from the printed circuit board 12 as the Peltier device 27 is positioned in the second cavity 28.

The Peltier heater/cooler device 27 may be used to actively cool the system spatial light modulator device 11 rather than just acting as a heatsink which passively dissipates heat generated by the spatial light modulator device 11. The Peltier heater/cooler device 27 may also be operated inversely and may be used to heat the spatial light modulator device 11. The heating mode may be useful for applications of the electronic component in which the electronic component is subjected to temperatures of less than 0° C. Such applications may be in automobiles, for example. The heating mode of operating the Peltier heater/cooler device 27 may be used to warm up the device to its minimum operating temperature. If the temperature of the spatial light modulator device 11 nears its maximum operating temperature, the direction of current applied to the Peltier heater/cooler device 27 may be reversed in order to provide active cooling of the spatial light modulator device 11.

Figure 2:
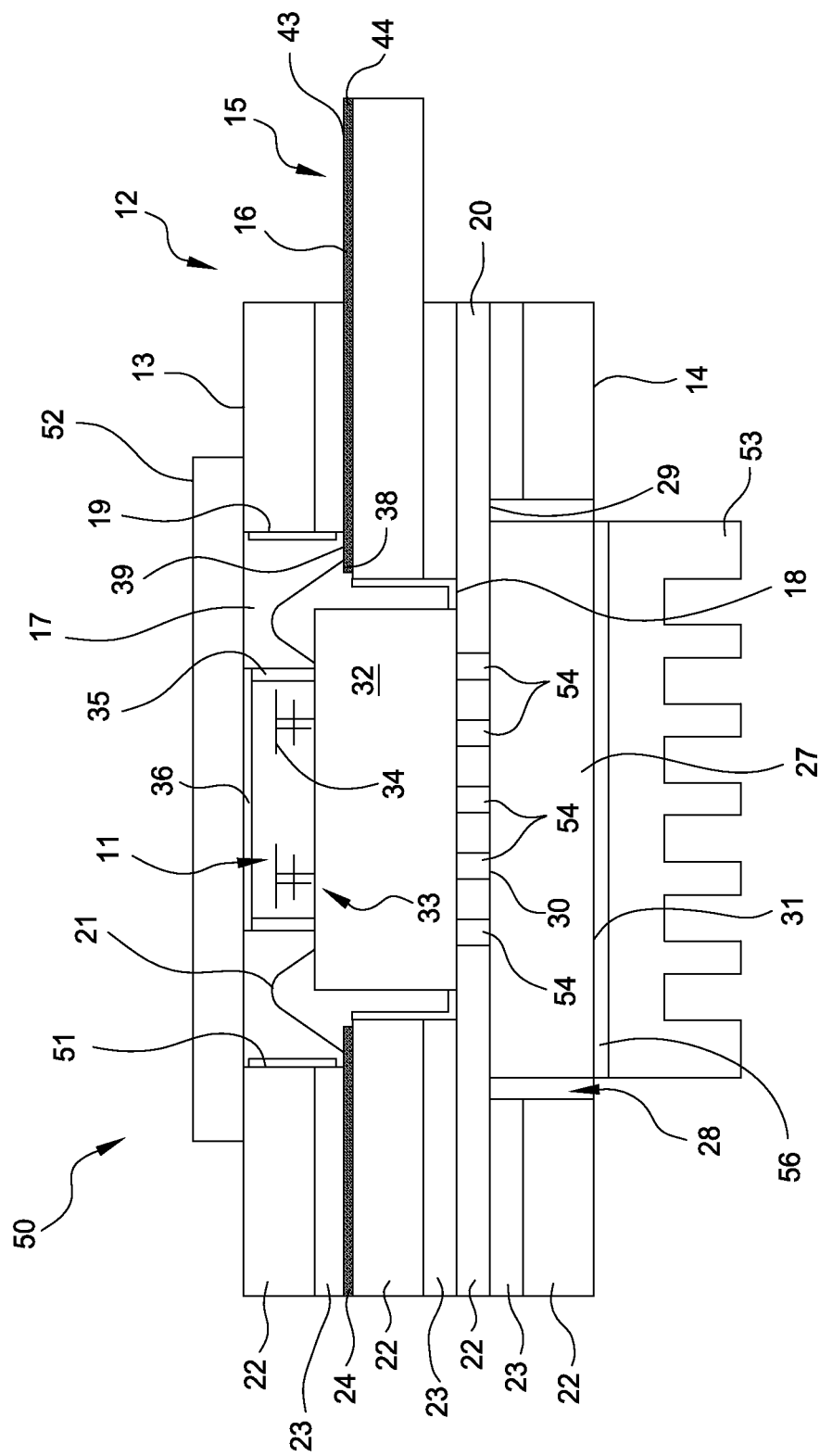
FIG. 2 is a cross sectional view of a second exemplary electronic component.

FIG. 2 illustrates a second exemplary electronic component 50. Electronic component 50 includes a circuit board 12 and a spatial light modulator device 11 as in the first example. Like reference numerals are used to indicate like features. The electronic component 50 differs from the electronic component 10 by the sealing arrangement for the first cavity 17.

The side walls 19 and the base 18 of the cavity 17 are covered by a metal layer 51 which is arranged to cover the material of the circuit board 12 but is electrically insulated from the redistribution layer 16 and the bond wires 21. The first cavity 17 is capped by a glass cap 52 which is mounted on the first major surface 13 of the circuit board 12 such that the glass cap 52 hermetically seals the first cavity 17. A hermetic seal for the first cavity 17 may be useful in applications in which the electronic component 14 is exposed to humid conditions.

The electronic component 50 further includes a heatsink 53 which is attached to the surface 31 of the Peltier heater/cooler device 27. The heat sink aids the dissipation of heat away from the electronic component 50. The heat sink 53 may be attached to the Peltier heater/cooler device 27 by a thermally conductive pad or adhesive 56. In some examples, the heatsink 53 may be laterally larger than the Peltier heater/cooler device 27.

In some examples, the surface 31 of the Peltier heater/cooler device 27 is coplanar with the second major surface 14 of the circuit board 12 and the heatsink 53 may be attached to the second major surface 14 of the circuit board 12 and to the surface 31 of the Peltier heater/cooler device 27.

The layer 20 forming the base 18 of the first cavity 17 and the base 29 of the second cavity 28 is provided by a dielectric layer 22 of the multilayer circuit board 12 in the electronic component 50. The dielectric layers 22 may be formed of a material such as FR4 (glass fibres embedded in epoxy). The thermal contact between the spatial light modulator device 11 and the Peltier heater/cooler device 27 may be increased by providing a plurality of through contacts 54 in the electric layer 20, the through contacts 54 including a material of a higher thermal conductivity that that of the dielectric material of the layer 20. The through contacts 54 may include a metal such as copper.

The arrangement and materials of the layer 20 of the electronic component 50 may also be used in the first exemplary electronic component illustrated in FIG. 1.

Figure 3:
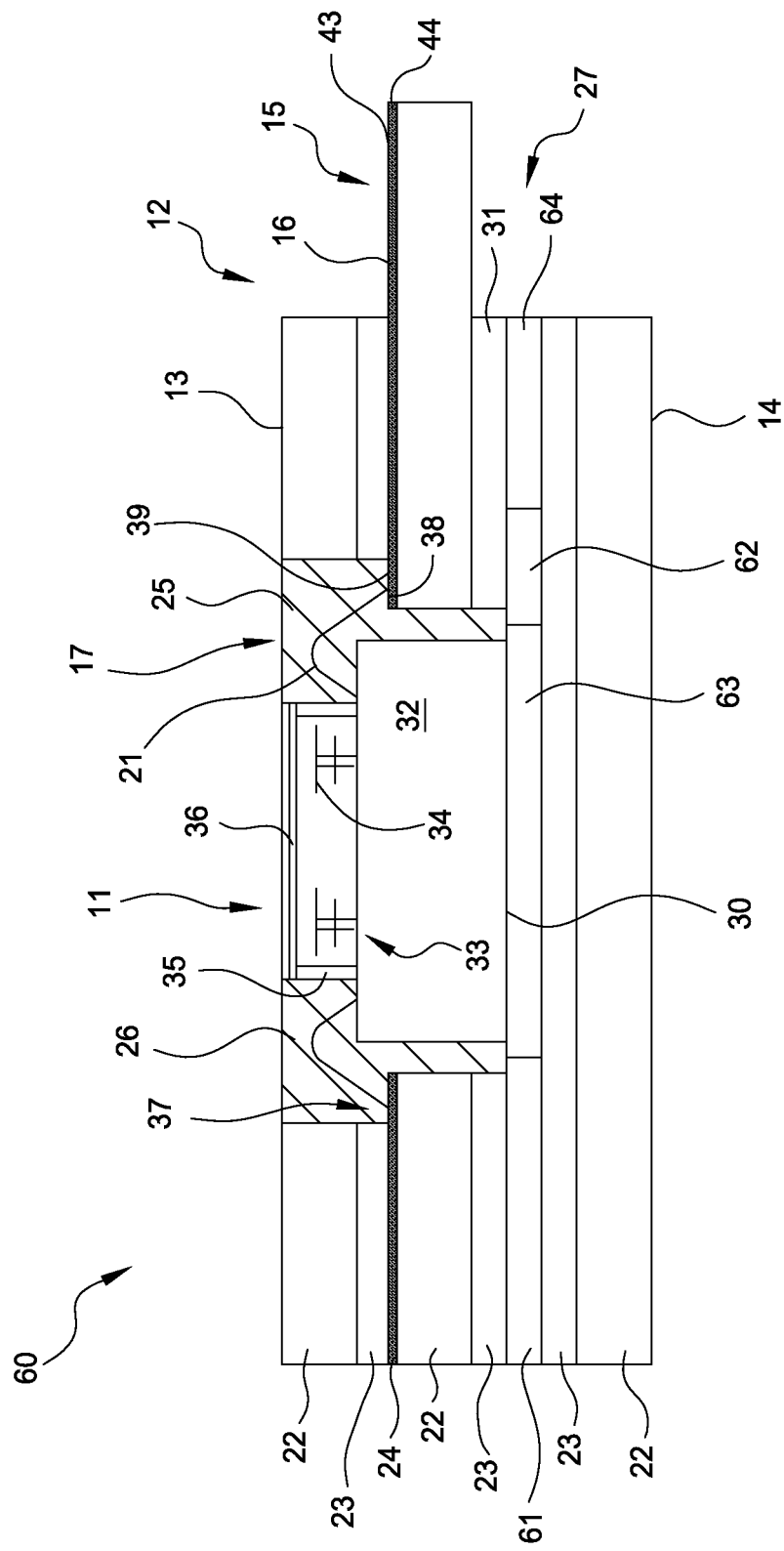
FIG. 3 is a cross sectional view of a third exemplary electronic component.

FIG. 3 illustrates a third exemplary electronic component 60. The electronic component 60 includes a circuit board 12 and spatial light modulator device 11 as in the first example. The electronic device 60 differs from that of the first example in the arrangement of the Peltier heater/cooler device 27. In the electronic component 60, the Peltier heater/cooler device 27 is integrated within the circuit board 12 and is arranged in a single layer 61 of the multilayer circuit board 12.

The Peltier heater/cooler device 27 comprises a first plurality of thermoelectric members 62 which are arranged in pairs of differing conductivity. Each pair includes an n-type conductivity thermoelectric member and a p-type conductivity thermoelectric member. The thermoelectric members 62 of a pair are electrically connected in series by first electrodes 63 which extend between thermoelectric members 62 of the pair. Adjacent pairs of thermoelectric members 62 are electrically connected by second electrodes 64. The first electrodes 63 are positioned underneath the spatial light modulator device 11 such that they are in thermal contact with the spatial light modulator device 11. The first electrodes 63 act as a first heater/cooler surface 30. The second electrodes 64 are positioned laterally adjacent the spatial light modulator device 11 and act as a second heater/cooler surface 31. In the event that the spatial light modulator device 11 is cooled, the first electrodes 63 provide the cold plane and the second electrodes 64 provide the hot plane of the Peltier cooler device.

The spatial light modulator device 11 may include a wafer-level-packaged digital micromirror device, but no carrier. The spatial light modulator device 11 is wire bonded directly to an inner layer of the redistribution system 15 of the circuit board 12 rather than being wire bonded to an additional carrier which is itself electrically connected to the circuit board 12.

The electronic components described herein in may be used in a head up display or rear projection display for automobile applications. In an automotive environment, electronic components are subjected to more extreme conditions such as low-temperature, high-temperature, vibrations and humidity. The electronic components according to the examples described herein may provide minimal thermal resistance so that heat can be transported free effectively from the spatial light modulator device 11 to a heat sink or a Peltier cooler device 27. The integration of the spatial light modulator device 11 into the circuit board 12 avoids the use of a further connector or socket and may help to improve high-speed signal quality. The fabrication of the spatial light modulator device 11 is also simplified as the hermetic sealing of the spatial light modulator device 11 and encapsulation of the bond wires 21 is performed after the integration of the spatial light modulator device 11 in the circuit board 12.

In the illustrated exemplary electronic components, the spatial light modulator device 11 is a digital micromirror device. However, other spatial light modulator devices may be used in place of the digital micromirror device. In a non-illustrated example, the spatial light modulator device is a scanning mirror device which includes a single micro-electro-mechanical (MEMs) mirror in place of the array of bistable micromirrors of the digital micromirror device. The single MEMs mirror is freely movable in two dimensions and scans the complete picture. If the electronic component includes a scanning mirror device, regions of the first cavity, within which the scanning mirror device is positioned, may be sealed with an encapsulant, such as a resin, or the first cavity may be hermetically sealed, for example by a metallic coating of the side walls and base of the cavity and a glass cap.

In a further non-illustrated exemplary electronic component, the spatial light modulator device is a Liquid Crystal on Silicon-type (LCoS) device which includes a base in the form of a chip and light modulation is performed by a TFT (Thin Film Transistor) structure and liquid crystal arranged on top of the chip. For a LCoS device, an encapsulant or a hermetic seal of the cavity, for example by a metallic coating and glass cap, can be omitted.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

The invention claimed is:

1. An electronic component, comprising:
   a spatial light modulator device;
   a circuit board comprising a first major surface, at least one electrically conductive redistribution layer and a first cavity positioned in the first major surface, the spatial light modulator device being positioned within the cavity and electrically connected to the redistribution layer;
   a Peltier heater/cooler device; and
   a second cavity positioned in a second major surface of the circuit board, wherein the Peltier heat/cooler device is mounted in the second cavity.

2. The electronic component of claim 1, wherein the spatial light modulator device is a micro-electro-mechanical system spatial light modulator device or a digital micromirror chip or a wafer-level-packaged digital micromirror device or a scanning mirror device or a liquid crystal on silicon device.

3. The electronic component of claim 1, wherein the spatial light modulator device includes a silicon chip with address circuitry and a micro-electro-mechanical structure including movable mirrors, the silicon chip being electrically connected to the redistribution layer by a plurality of bond wires extending between the silicon chip and the redistribution layer.

4. The electronic component of claim 1, wherein regions between the spatial light modulator device and side walls of the first cavity are filled with an encapsulant.

5. The electronic component of claim 1, wherein the first cavity comprises a base and side walls, a metallic layer is arranged on the side walls and on the base and the cavity is sealed by a glass cap.

6. The electronic component of claim 1, further comprising a heat sink in thermal contact with the spatial light modulator device.

7. The electronic component of claim 1, further comprising a second cavity positioned in a second major surface of the circuit board, wherein a portion of an inner electrically conductive redistribution layer forms the base of the first cavity and a base of the second cavity.

8. The electronic component of claim 1, wherein the spatial light modulator device is electrically connected to the redistribution layer by bond wires.

9. The electronic component of claim 8, wherein the bond wires extend between the spatial light modulator device and an electrically conductive inner redistribution layer of the circuit board.

10. The electronic component of claim 1, wherein the first cavity comprises a base and side walls and the spatial light modulator device is arranged on the base and entirely within the cavity.

11. The electronic component of claim 10, wherein a portion of an inner redistribution layer forms the base of the first cavity.

12. The electronic component of claim 1, wherein the Peltier heater/cooler device comprises a first heater/cooler surface, at least one pair of thermoelectric members and a second heater/cooler surface, the first heater/cooler surface, the thermoelectric members and the second heater/cooler surface being coplanar and being at least partially embedded between layers of the circuit board.

13. The electronic component of claim 12, wherein the spatial light modulator device is mounted on the first heater/cooler surface.

* * * * *